US007431040B2

(12) United States Patent
Kosugi

(10) Patent No.: US 7,431,040 B2
(45) Date of Patent: Oct. 7, 2008

(54) METHOD AND APPARATUS FOR DISPENSING A RINSE SOLUTION ON A SUBSTRATE

(75) Inventor: Hitoshi Kosugi, Beaverton, OR (US)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 10/673,254

(22) Filed: Sep. 30, 2003

(65) Prior Publication Data

US 2005/0067000 A1 Mar. 31, 2005

(51) Int. Cl.
*H01L 21/304* (2006.01)

(52) U.S. Cl. ........................ 134/178; 134/172; 134/1.3; 134/1.2; 134/902

(58) Field of Classification Search .................. 134/178
See application file for complete search history.

(56) References Cited

U.S. PATENT DOCUMENTS

| | | | | |
|---|---|---|---|---|
| 5,879,576 | A * | 3/1999 | Wada et al. | 216/91 |
| 5,896,875 | A * | 4/1999 | Yoneda | 134/102.3 |
| 5,975,098 | A * | 11/1999 | Yoshitani et al. | 134/148 |
| 6,048,409 | A * | 4/2000 | Kanno et al. | 134/34 |
| 6,357,457 | B1 * | 3/2002 | Taniyama et al. | 134/57 R |
| 6,645,874 | B1 * | 11/2003 | Torek et al. | 438/723 |
| 6,688,784 | B1 * | 2/2004 | Templeton | 396/611 |
| 6,745,784 | B2 * | 6/2004 | Katakabe et al. | 134/153 |
| 6,748,672 | B2 * | 6/2004 | Lee et al. | 34/630 |
| 6,751,824 | B2 * | 6/2004 | Oh et al. | 15/77 |
| 6,770,424 | B2 * | 8/2004 | Mandal et al. | 430/311 |
| 6,817,369 | B1 * | 11/2004 | Riedel et al. | 134/98.1 |
| 6,824,621 | B2 * | 11/2004 | Shibagaki | 134/26 |
| 6,874,516 | B2 * | 4/2005 | Matsuno et al. | 134/148 |

FOREIGN PATENT DOCUMENTS

| | | | |
|---|---|---|---|
| JP | 11195635 | * | 5/1998 |
| JP | 11195635 A | * | 7/1999 |

* cited by examiner

*Primary Examiner*—Michael Barr
*Assistant Examiner*—Jason P Riggleman
(74) *Attorney, Agent, or Firm*—Oblon, Spivak, McClelland, Maier & Neustadt, P.C.

(57) ABSTRACT

An apparatus and method for dispensing a rinse solution on a substrate in which the rinse solution is dispensed through one nozzle array substantially near a center of a substrate and is dispensed through a second nozzle array across a radial span of the substrate. Accordingly, the apparatus includes a first nozzle array including at least one nozzle and configured to dispense the rinse solution substantially near a center of the substrate, a first control valve coupled to the first nozzle array and configured to actuate a first flow rate of the rinse solution through the first nozzle array, a second nozzle array including a plurality of nozzles and configured to dispense the rinse solution across a radial span of the substrate, and a second control valve coupled to the second nozzle array and configured to actuate a second flow rate of said rinse solution through the second nozzle array.

11 Claims, 7 Drawing Sheets

METHOD AND APPARATUS FOR DISPENSING A RINSE SOLUTION ON A SUBSTRATE

BACKGROUND OF THE INVENTION

1. Field of the Invention

The present invention relates to a method and apparatus for dispensing a rinse solution on a substrate, and, more particularly, to a method and apparatus for dispensing a rinse solution on a substrate to effectively remove resist defects while preventing chemical damage to the substrate.

2. Description of the Related Art

In material processing methodologies, pattern etching includes the application of a thin layer of light-sensitive material, such as photoresist, to an upper surface of a substrate that is subsequently patterned in order to provide a mask for transferring this pattern to the substrate during etching. The patterning of the light-sensitive material generally involves coating an upper surface of the substrate with a thin film of light-sensitive material, exposing the thin film of light-sensitive material to a radiation source through a reticle (and associated optics) using, for example, a micro-lithography system, followed by a developing process during which the removal of the irradiated regions of the light-sensitive material occurs (as in the case of positive photoresist), or the removal of non-irradiated regions occurs (as in the case of negative resist) using a developing solvent.

As is known to those skilled in the art of semiconductor manufacturing, the formation of the patterned mask can incur a number of defects including substrate defects, defects in the light-sensitive material, and defects in any one of the many process steps leading to the formation of the patterned film. For example rinsing and drying procedures used for the manufacture of semiconductor devices and the problems of particle retention and defect generation are described in U.S. Pat. No, 5,938,857, the entire content of which is incorporated herein by reference. Further, pending US application no. US 2003/0044731, the entire content of which is incorporated herein by reference, also describes the problem of resist defects.

The defects incurred in forming the pattern mask are often manifest as residual contamination retained in the patterned mask and/or substrate. Therefore, subsequent to the overall process for forming a patterned mask, a cleaning step is required, wherein a rinse solution is dispensed upon the substrate in order to remove resist defects. The present inventors have discovered, however, that conventional rinse systems and methods either provide insufficient removal of rinse defects or cause substrate damage.

SUMMARY OF THE INVENTION

One object of the present invention is to provide a method and apparatus for rinsing a substrate (e.g. a semiconductor wafer) which overcomes or reduces problems of conventional rinsing systems.

Another object of the present invention is to provide a method and apparatus for rinsing a substrate, which provides sufficient removal of resist defects, while minimizing formation of substrate defects.

Accordingly, in one aspect of the present invention, a rinse solution nozzle assembly for dispensing a rinse solution on a substrate includes a first nozzle array including at least one nozzle and configured to dispense the rinse solution substantially near a center of the substrate, a first control valve having a first outlet end coupled to the first nozzle array and configured to actuate a first flow rate of the rinse solution through the first nozzle array, a second nozzle array including a plurality of nozzles and configured to dispense the rinse solution across a radial span of the substrate, a second control valve having a second outlet end coupled to the second nozzle array and configured to actuate a second flow rate of the rinse solution through the second nozzle array, and a controller coupled to the first control valve and the second control valve and configured to control the first flow rate through the first nozzle array and control the second flow rate through the second nozzle array.

In another aspect of the present invention, a cleaning system for providing a rinse solution on a substrate includes a cleaning chamber, a substrate holder coupled to the cleaning chamber and configured to support the substrate, a drive unit coupled to the substrate holder and configured to rotate the substrate holder, a rinse solution nozzle assembly coupled to the cleaning chamber and configured to dispense the rinse solution in the cleaning chamber. The rinse solution nozzle assembly includes a first nozzle array including at least one nozzle and configured to dispense the rinse solution substantially near a center of the substrate, a first control valve having a first outlet end coupled to the first nozzle array and configured to actuate a first flow rate of the rinse solution through the first nozzle array, a second nozzle array including a plurality of nozzles and configured to dispense the rinse solution across a radial span of the substrate, a second control valve having a second outlet end coupled to the second nozzle array and configured to actuate a second flow rate of the rinse solution through the second nozzle array, and a controller coupled to the first control valve and the second control valve of the rinse solution nozzle assembly, and configured to control the first flow rate through the first nozzle array and control the second flow rate through the second nozzle array.

In another aspect of the present invention, a method for dispensing a rinse solution on a substrate includes rotating the substrate, dispensing the rinse solution from a first nozzle array on the substrate for a first period of time, following the first period of time dispensing the rinse solution from the first nozzle array and a second nozzle array on the substrate for a second period of time, terminating the dispensing of the rinse solution from the first nozzle array and the second nozzle array on the substrate, and terminating the rotating of the substrate. The method dispenses from the first nozzle array the rinse solution substantially near a center of the substrate, and dispenses from the second nozzle array the rinse solution across a radial span of the substrate.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF EXEMPLARY EMBODIMENTS

Embodiments of the present invention will be described in detail below with reference to the accompanying drawings. As an embodiment according to the present application, an apparatus for dispensing a rinse solution on a substrate utilized for a resist solution coating-developing system in semiconductor manufacturing will be described below.

Figure 1:
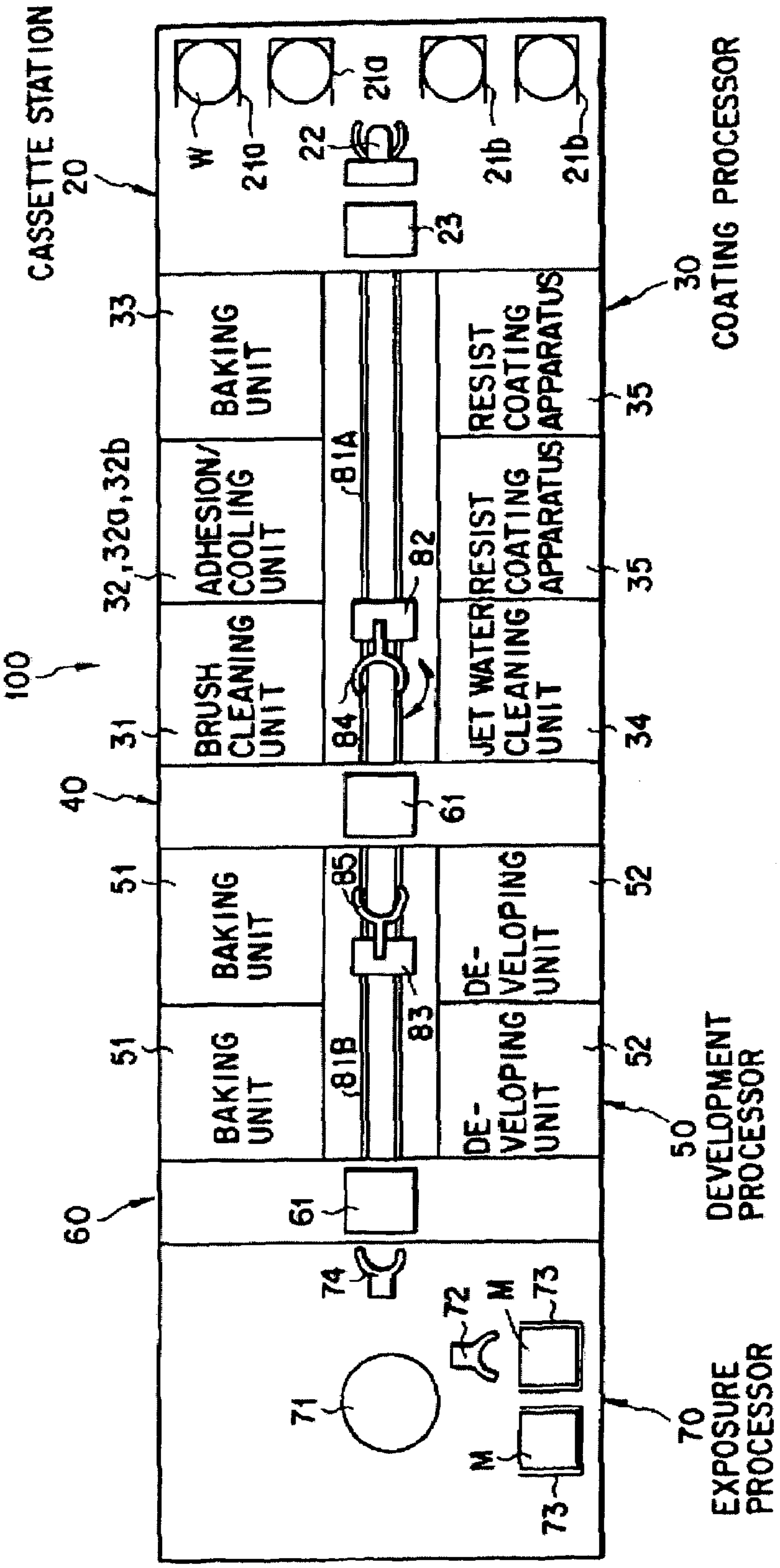
FIG. 1 is a schematic view of a resist solution coating-developing system of the present invention including a film forming apparatus.

Referring now to the drawings, FIG. 1 is a schematic view showing a resist solution coating-developing system according to one embodiment of the apparatus for dispensing a rinse solution. As shown in FIG. 1, a resist solution coating-developing system 100 includes a cassette station 20 in which first cassettes 21*a* for storing unprocessed objects, e.g., substrates (or wafers W) and second cassettes 21*b* for storing processed substrates (or wafers W) are arranged in respective predetermined positions. The cassette station 20 includes a substrate transfer forceps 22 for loading and unloading substrates between cassettes 21*a* and 21*b* and a transfer table 23, a coating processor 30 coupled to the cassette station 20 to form a resist film on the surface of the substrate, a development processor 50 coupled to the coating processor 30 with an interface unit 40 to develop the exposed substrate, and an exposure processor 70. The exposure processor is coupled to a development processor 50 via an interface unit 60 to irradiate ultraviolet light from a light source onto the coated substrate through a predetermined mask member M and expose the resist film to a predetermined circuit pattern.

Linear transfer paths 81A and 82B extend in central portions of the coating processor 30 and the development processor 50, respectively. Transfer mechanisms 82 and 83 are movable along the transfer paths 81A and 81B, respectively. The transfer mechanisms 82 and 83 have substrate arms 84 and 85, respectively, which can move in X and Y directions in a horizontal plane and in a vertical direction (Z direction) and freely rotate (θ).

On one side along the side edge of the transfer path 81A in the coating processor 30, a brush cleaning unit 31, an adhesion/cooling unit 32 which performs a hydrophobic treatment and in which an adhesion unit 32*a* and a cooling unit 32*b* are stacked, and a baking unit 33 as a first heating unit are arranged adjacent to each other along a line. On the other side of the transfer path 81A, a jet water cleaning unit 34 and an arbitrary number of, for example, two resist coating apparatuses 35 as film forming apparatuses are arranged adjacent to each other in a line. The resist coating apparatuses 35 can spin-coat substrates with two types of resist solutions: a regular resist solution and an antireflection resist solution.

The baking unit 33 and the resist coating apparatuses 35 oppose each other on the two sides of the transfer path 81A. Since the baking unit 33 and the resist coating apparatuses 35 thus oppose each other at a distance on the two sides of the transfer path 81A, heat from the baking unit 33 is prevented from being conducted to the resist coating apparatuses 35. Consequently, when resist coating is performed the resist film can be protected from thermal influences.

Although the apparatus for dispensing a rinse solution is described in the context of a jet water cleaning unit in a resist solution coating-developing system, the present invention is merely illustrated and not limited in any way in scope by this example.

Figure 2:
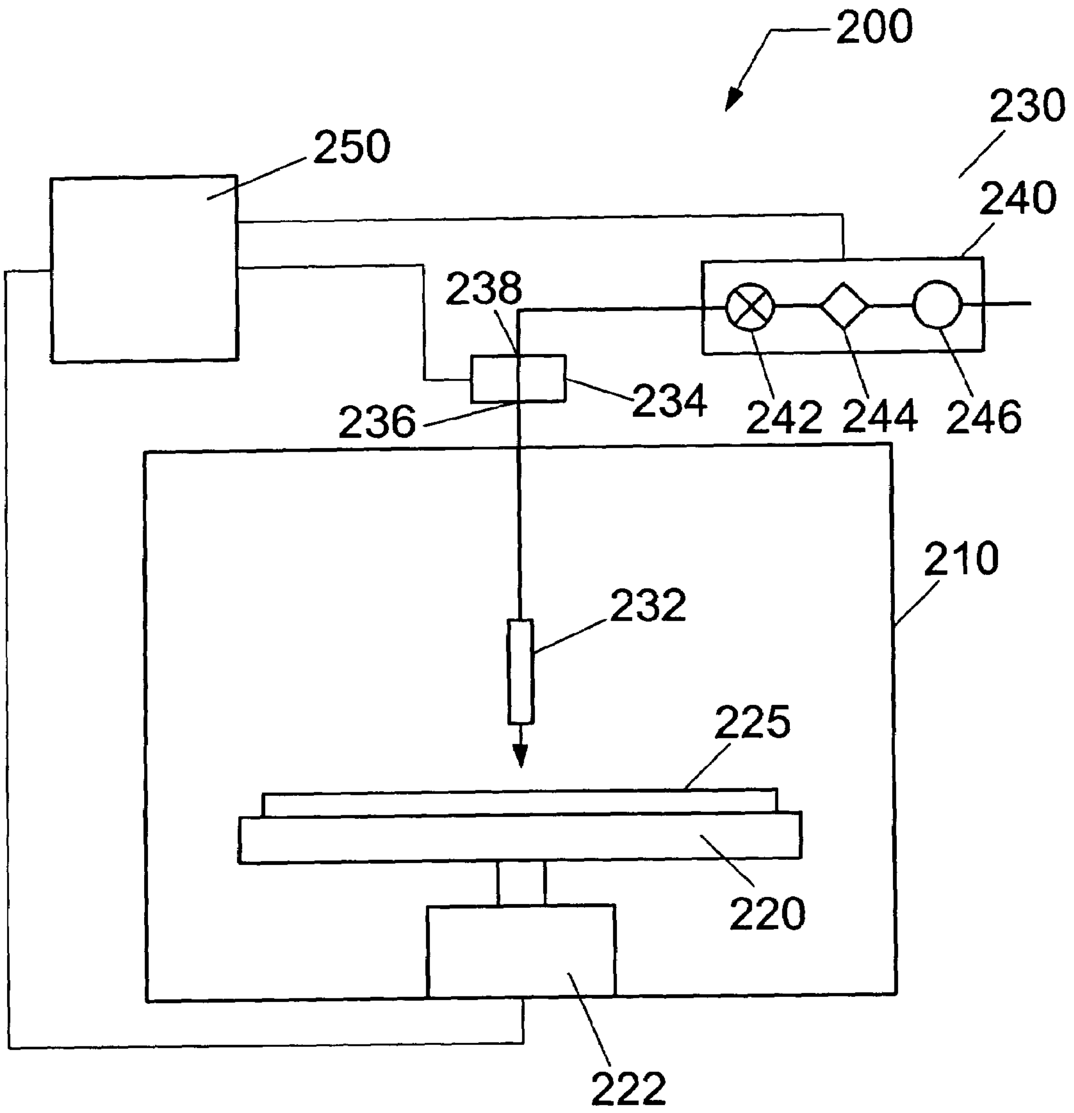
FIG. 2 is an illustration of a conventional method and apparatus for dispensing a rinse solution on a substrate.

FIG. 2 illustrates a conventional cleaning system 200 including a cleaning chamber 210, a substrate holder 220 coupled to the cleaning chamber 210 and configured to support substrate 225, and a rinse solution nozzle assembly 230. Additionally, the cleaning system 200 includes a controller 250 coupled to the substrate holder 220 and the rinse solution nozzle assembly 230, and configured to exchange data, information, and control signals with the substrate holder 220 and the rinse solution nozzle assembly 230.

The substrate holder 220 is configured to rotate (or spin) substrate 225 during dispensing of rinse solution on the upper surface of substrate 225 from the rinse solution nozzle assembly 230. A drive unit 222 coupled to the substrate holder 220 is configured to rotate the substrate holder 220. The drive unit 222 can, for example, permit setting the rotation rate, and the rate of acceleration of the substrate holder rotation.

The rinse solution nozzle assembly 230 includes a single nozzle 232 positioned substantially near the center of substrate 225, and above an upper surface thereof. The nozzle 232 is configured to dispense a rinse solution, such as deionized water, on an upper surface of substrate 225 in a direction substantially perpendicular to the upper surface of substrate 225. The nozzle 232 is coupled to an outlet end 236 of a control valve 234. An inlet end 238 of control valve 234 is coupled to a rinse solution supply system 240. The control valve 234 can be configured to regulate dispensing the rinse solution on substrate 225. When open, the rinse solution is dispensed upon the substrate 225. When closed, the rinse solution is not dispensed upon the substrate 225. The rinse solution supply system 240 can include at least one of a fluid supply valve 242, a filter 244, and a flow measurement/control device 246.

A typical rinse process includes three steps including a first step of accelerating the rotation of substrate 225 to a first pre-specified rotation rate and maintaining the rate of rotation for a first period of time. The first step occurs while dispensing rinse solution atop the upper surface of substrate 225. A second step includes further accelerating the rotation of substrate 225 to a second pre-specified rotation rate and maintaining the rate of rotation for a second period of time, while terminating the dispensing of rinse solution on substrate 225. A third step includes decelerating the rotation of substrate 225 to rest. Table I present a typical rinse process for the rinse solution nozzle assembly 230 of FIG. 2 having the three steps discussed above.

The present inventors have recognized that a shortcoming of the rinse solution nozzle assembly of FIG. 2 and the process for dispensing rinse solution is that the center of substrate 225 is the only location where the substrate surface is subject to hydraulic pressure due to the impingement of the rinse solution jet from nozzle 232. Therefore, the rinse solution nozzle assembly and the process for its use are not sufficiently effective in the removal of resist defects across the entire substrate.

TABLE I

| TIME (sec) | SPEED (RPM) | ACCELERATION (RPM/sec) | DISPENSING SCHEME |
|---|---|---|---|
| 30 | 1000 | 10000 | center nozzle 232 ON |
| 15 | 2000 | 10000 | center nozzle 232 OFF |
| 1 | 0 | 3000 | center nozzle 232 OFF |

Figure 3:
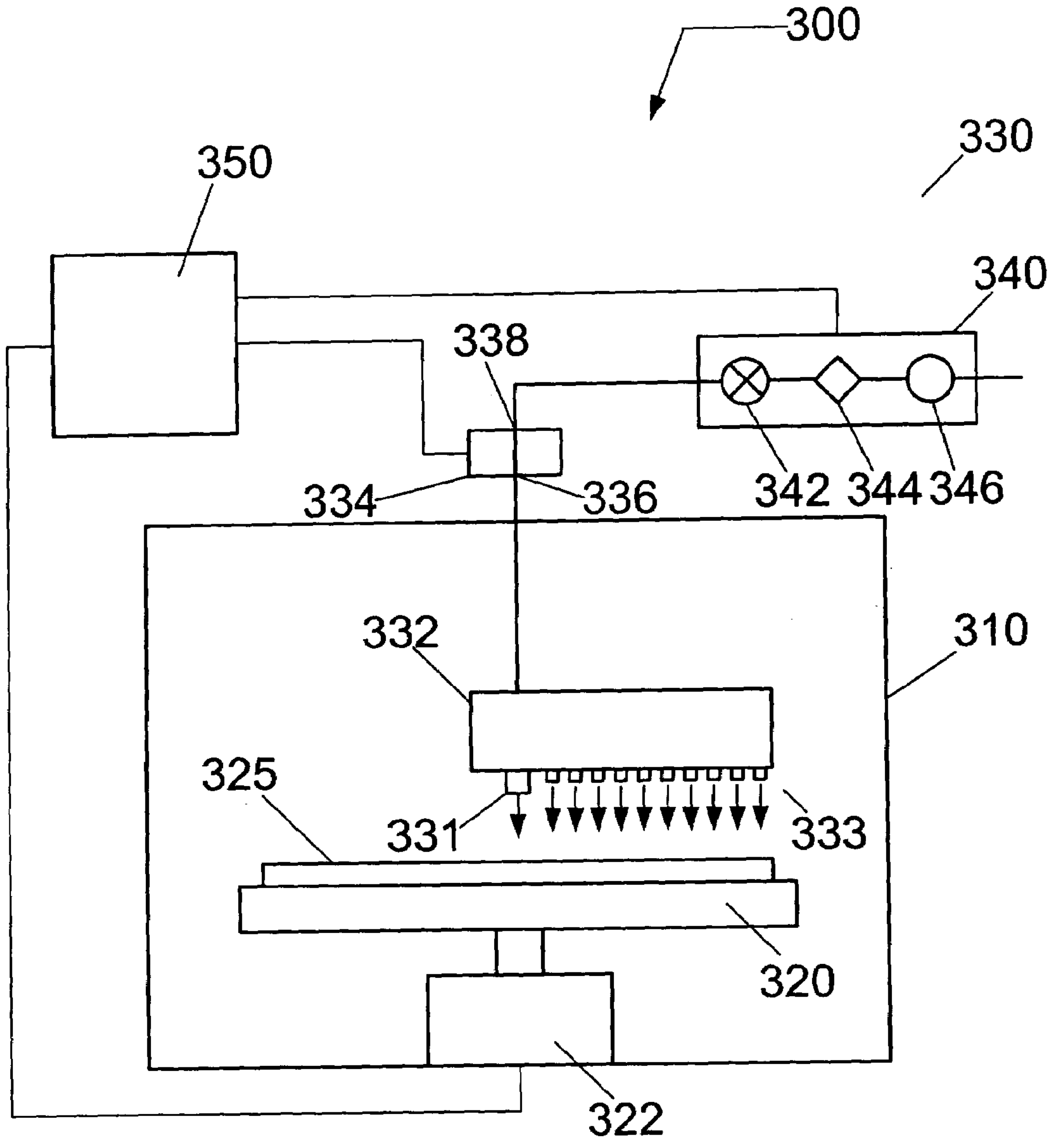
FIG. 3 is an illustration of another conventional method and apparatus for dispensing a rinse solution on a substrate.

FIG. 3 depicts as another cleaning system 300 including a cleaning chamber 310, a substrate holder 320 coupled to the cleaning chamber 310 and configured to support substrate 325, and a rinse solution nozzle assembly 330. Additionally, the cleaning system 300 includes a controller 350 coupled to the substrate holder 320, and the rinse solution nozzle assembly 330, and configured to exchange data, information, and control signals with the substrate holder 320 and the rinse solution nozzle assembly 330.

The substrate holder 320 is configured to rotate (or spin) substrate 325 during dispensing of rinse solution on the upper surface of substrate 325 from the rinse solution nozzle assembly 330. A drive unit 322 coupled to the substrate holder 320 is configured to rotate the substrate holder 320. The drive unit 322 can, for example, permit setting the rotation rate, and the rate of acceleration of the substrate holder rotation.

The rinse solution nozzle assembly 330 includes an array of nozzles 331 having a first nozzle 332 positioned substantially near the center of substrate 325 and above an upper surface thereof, and an array of sub-nozzles 333 positioned along a radial span of substrate 225 and above an upper surface thereof. The array of nozzles 331 is configured to dispense a rinse solution, such as de-ionized water, on an upper surface of substrate 325 in a direction substantially perpendicular to the upper surface of substrate 325. The array of nozzles 331 is coupled to an outlet end 336 of a control valve 334. An inlet end 338 of control valve 334 is coupled to a rinse solution supply system 340. The control valve 334 can be configured to regulate dispensing the rinse solution on substrate 325. When open, rinse solution is dispensed upon the substrate 325. When closed, rinse solution is not dispensed upon the substrate 325. The rinse solution supply system 340 can include at least one of a fluid supply valve 342, a filter 344, and a flow measurement/control device 346.

As with the single nozzle assembly, a typical rinse process of the system in FIG. 3 includes three steps, including a first step of accelerating the rotation of substrate 325 to a first pre-specified rotation rate and maintaining the rate of rotation for a first period of time. The first step occurs while dispensing rinse solution atop the upper surface of substrate 325. A second step includes further accelerating the rotation of substrate 325 to a second pre-specified rotation rate and maintaining the rate of rotation for a second period of time, while terminating the dispensing of rinse solution on substrate 325. A third step includes decelerating the rotation of substrate 325 to rest. Table II presents a typical rinse process for the rinse solution nozzle assembly 330 of FIG. 3 having the three steps discussed above.

TABLE II

| TIME (sec) | SPEED (RPM) | ACCELERATION (RPM/sec) | DISPENSING SCHEME |
|---|---|---|---|
| 30 | 1000 | 10000 | nozzle array 331 ON |
| 15 | 2000 | 10000 | nozzle array 331 OFF |
| 1 | 0 | 3000 | nozzle array 331 OFF |

Although rinse solution nozzle assembly 330 (FIG. 3) and the process for its use (Table II) provide hydraulic pressure across the span of substrate 325 during substrate rotation, the present inventors have discovered that the chemical interaction of the rinse solution with the substrate surface can lead to adverse chemical reactions at the surface and, hence, surface damage across the substrate. For example, the rinse process typically follows a developing process which exposes the substrate surface to a developing solution. Following the developing process, the exposed substrate surface can retain residual developing solution. Developing solutions are generally high in alkalinity (high pH) relative to a neutral pH (i.e., a pH of 7.0) of de-ionized water. Immediate exposure of the high alkalinity developing solution on the substrate surface to de-ionized water can result in adverse chemical reactions (i.e., pH shock), which causes substrate damage.

Figure 4:
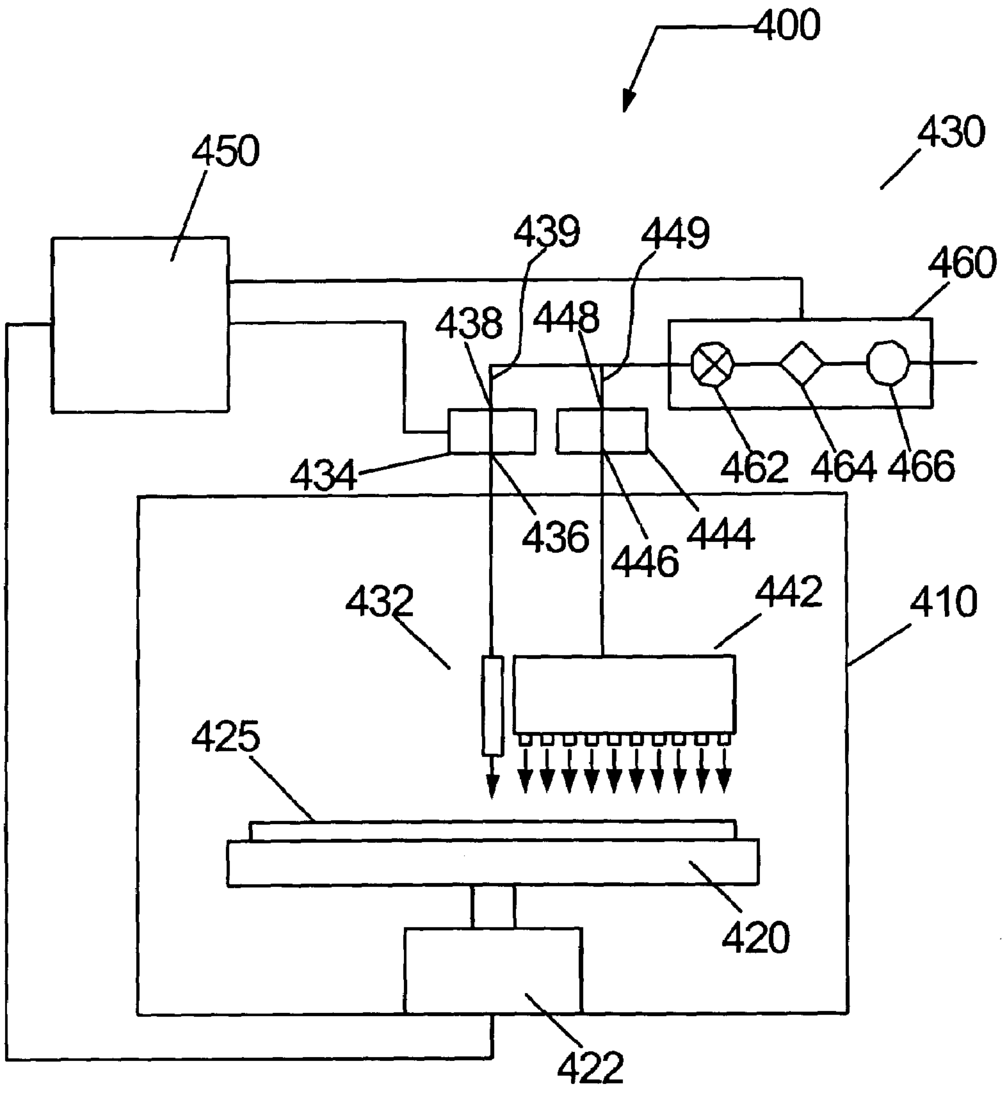
FIG. 4 depicts an apparatus for dispensing a rinse solution on a substrate according to one embodiment of the present invention.

FIG. 4 depicts as one embodiment of the present invention a cleaning system 400. The cleaning system 400 includes a cleaning chamber 410, a substrate holder 420 coupled to the cleaning chamber 410 and configured to support substrate 425, and a rinse solution nozzle assembly 430. Additionally, the cleaning system 400 includes a controller 450 coupled to the substrate holder 420, and the rinse solution nozzle assembly 430, and configured to exchange data, information, and control signals with the substrate holder 420 and the rinse solution nozzle assembly 430.

The substrate holder 420 is configured to rotate (or spin) substrate 425 during dispensing of rinse solution on the upper surface of substrate 425 from the rinse solution nozzle assembly 430. A drive unit 422 coupled to the substrate holder 420 is configured to rotate the substrate holder 420. The drive unit 422 can, for example, permit setting the rotation rate, and the rate of acceleration of the substrate holder rotation.

The rinse solution nozzle assembly 430 includes a first nozzle array 432 configured to dispense the rinse solution substantially near a center of substrate 425. The first nozzle array 432 includes at least one nozzle coupled to a first outlet end 436 of a first control valve 434 (only one nozzle shown in FIG. 4. Thus, the term "nozzle array" as used herein describes a single nozzle or a plurality of nozzles, which may be in a row or grouped in a cluster). The first control valve 434 is configured to actuate a first flow rate of the rinse solution through the first nozzle array 432. The rinse solution nozzle assembly 430 further includes a second nozzle array 442 configured to dispense the rinse solution across a radial span of substrate 425. The second nozzle array 442 includes a plurality of nozzles coupled to an outlet end 446 of a second control valve 444. The second control valve 444 is configured to actuate a second flow rate of the rinse solution through the second nozzle array 442. Moreover, the controller 450 is coupled to the first control valve 434 and the control second valve 444, and configured to control the first flow rate through the first nozzle array 432 and control the second flow rate through the second nozzle array 442.

The at least one nozzle of the first nozzle array 432 can be oriented to inject a rinse solution in a direction perpendicular to substrate 425. Alternatively, the at least one nozzle can be oriented to inject rinse solution in a direction that is not perpendicular to the substrate surface. For example, the angular direction can be at an acute angle off a perpendicular incidence. At least one of the plurality of nozzles, of the second nozzle array 442 can be oriented to inject rinse solution in a direction perpendicular to substrate 425. Alternatively, at least one of the plurality of nozzles can be oriented to inject rinse solution in a direction that is not perpendicular to the substrate surface. For example, the angular direction can be at an acute angle off a perpendicular incidence.

An inlet end 438 of first control valve 434 is coupled to a rinse solution supply system 460 via fluid supply line 439. The first control valve 434 can be configured to regulate dispensing the rinse solution from the first nozzle array 432 on substrate 425. For example, when open, rinse solution is dispensed from the first nozzle array 432 upon substrate 425. When closed, a rinse solution is not dispensed upon the substrate 425. An inlet end 448 of second control valve 444 is coupled to rinse solution supply system 460 via fluid supply line 449. The second control valve 444 can be configured to regulate dispensing the rinse solution from the second nozzle array 442 on substrate 425. For example, when open, a rinse solution is dispensed from the second nozzle array 442 upon substrate 425. When closed, a rinse solution is not dispensed upon the substrate 425. The rinse solution supply system 460 can include at least one of a fluid supply valve 462, a filter 464, and a flow measurement/control device 466. In an alternate embodiment, at least one of fluid supply line 439 and fluid supply line 449 includes a secondary mass flow measurement/control device in order to affect the partitioning of rinse solution flow rates to the first nozzle array 432 and the second nozzle array 442, respectively, from the rinse solution supply system 460.

Controller 450 includes a microprocessor, memory, and a digital I/O port (potentially including D/A and/or A/D converters) capable of generating control voltages sufficient to communicate and activate inputs to the drive unit 422 of substrate holder 420, the rinse solution nozzle assembly 430 (e.g., first control valve 434 and second control valve 444), and rinse solution supply system 460 as well as monitor outputs from these systems. A program stored in the memory is utilized to interact with these systems according to a stored process recipe. One example of controller 450 is a DELL PRECISION WORKSTATION 530™, available from Dell Corporation, Austin, Tex. The controller 450 may also be implemented as a general purpose computer such as the computer described with respect to FIG. 7.

Controller 450 may be locally located relative to cleaning system 400, or it may be remotely located relative to the cleaning system 400 via an internet or intranet. Thus, controller 450 can exchange data with cleaning system 400 using at least one of a direct connection, an intranet, and the internet. Controller 450 may be coupled to an intranet at a customer site (i.e., a device maker, etc.), or coupled to an intranet at a vendor site (i.e., an equipment manufacturer). Furthermore, another computer (i.e., controller, server, etc.) can access controller 450 to exchange data via at least one of a direct connection, an intranet, and the internet.

Thus, the system of FIG. 4 includes nozzle arrays 432 and 442 that are separately controllable by control valves 434 and 444 respectively. The present inventors discovered that such separate control allows a rinse process that effectively removes particles from the pattern mask and/or substrate, while minimizing substrate defects. Specifically, in a first step, a rinse solution is dispensed only from the first nozzle array 432, hence, permitting time to gradually neutralize the substrate surface conditions as rinse solution spreads radially outward on the substrate surface under the centrifugal forces imposed by the substrate rotation thereby reducing the pH shock that causes substrate defects. In the second step, rinse solution can be dispensed from both the first nozzle array 432 and the second nozzle array 442 in order to provide a hydraulic force to the entirety of the substrate during substrate rotation and, therefore, effectively remove defects from the substrate surface.

According to an embodiment of the present invention, a rinse process implementing the rinse solution nozzle assembly 430 depicted in FIG. 4 can include four steps including a first step of accelerating the rotation of substrate 425 to a first pre-specified rotation rate and maintaining the rate of rotation for a first period of time. The first step occurs while dispensing rinse solution atop the upper surface of substrate 425 from the first nozzle array 432. A second step includes accelerating or decelerating the rotation of substrate 425 to a second pre-specified rotation rate and maintaining the rate of rotation for a second period of time. The second pre-specified rotation rate can be the same as the first pre-specified rotation rate and, therefore, no acceleration or deceleration is required. The second step occurs while dispensing rinse solution atop the upper surface of substrate 425 from the first nozzle array 432 and the second nozzle array 442. A third step includes further accelerating the rotation of substrate 425 to a third pre-specified rotation rate and maintaining the rate of rotation for a third period of time, while terminating the dispensing of rinse solution on substrate 425 from the first nozzle array 432 and the second nozzle array 442. A fourth step includes decelerating the rotation of substrate 425 to rest. Table III presents a rinse process for the rinse solution nozzle assembly 430 of FIG. 4 having the four steps discussed above.

Figure 5:
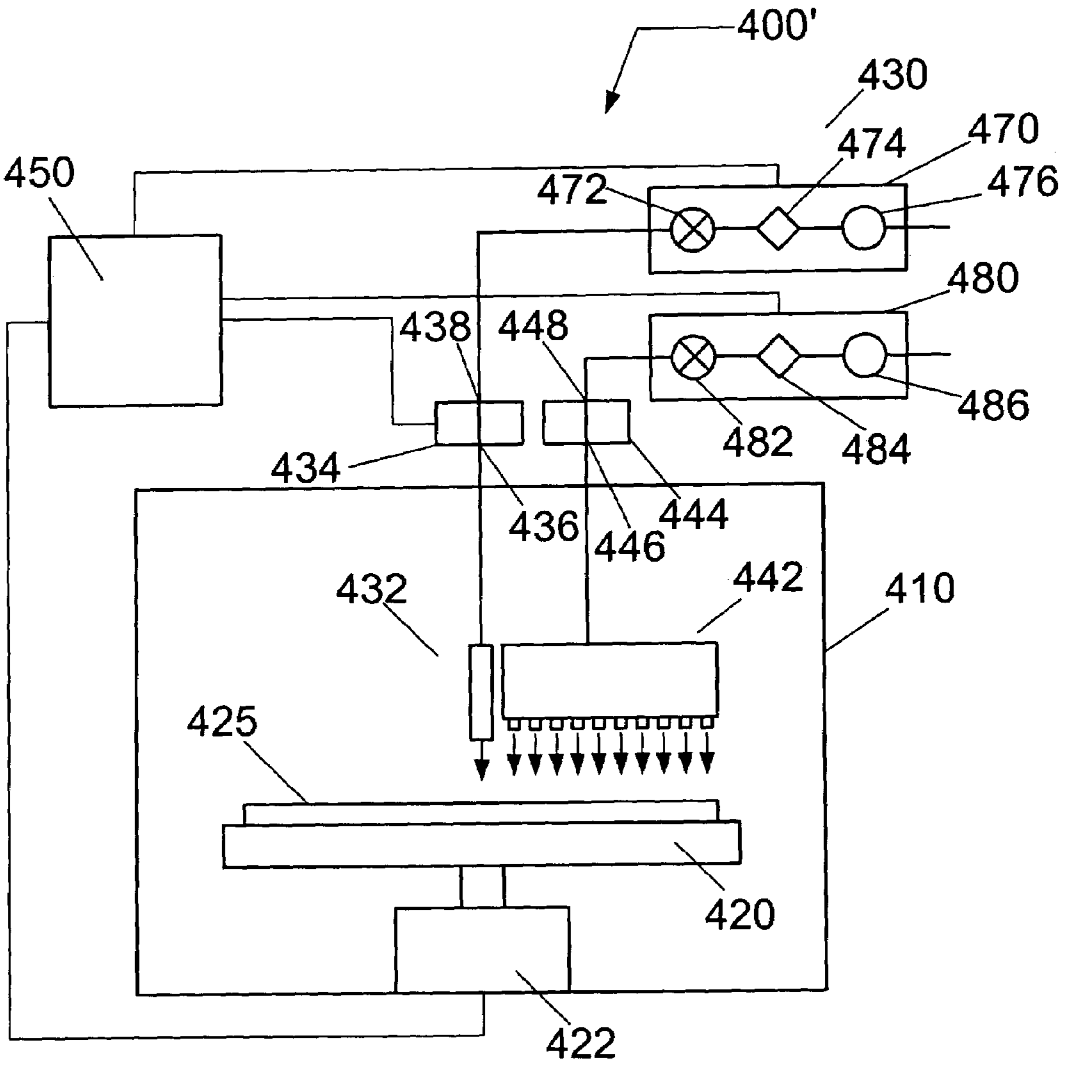
FIG. 5 depicts an apparatus for dispensing a rinse solution on a substrate according to another embodiment of the present invention.

In an alternate embodiment, FIG. 5 depicts a cleaning system 400' that includes many of the same elements as cleaning system 400 of FIG. 5, except that cleaning system 400' has a first rinse solution supply system 470 coupled to the first inlet end 438 of first control valve 434, and a second rinse solution supply system 480 coupled to the second inlet end 448 of second control valve 444. The first rinse solution supply system 470 can include at least one of a fluid supply valve 472, a filter 474, and a flow measurement/control device 476. The second rinse solution supply system 480 can include at least one of a fluid supply valve 482, a filter 484, and a flow measurement/control device 486. Utilization of the first rinse solution supply system 470 and the second rinse solution supply system 480 enables independent control of the rinse solution flow rates delivered to the first array of nozzles 432 and the second array of nozzles 442, respectively in order to realize the benefits of the present invention.

TABLE III

| TIME (sec) | SPEED (RPM) | ACCELERATION (RPM/sec) | DISPENSING SCHEME |
|---|---|---|---|
| 10 | 1000 | 10000 | first nozzle array 432 ON; second nozzle array 433 OFF |
| 20 | 1000 | 10000 | first nozzle array 432 ON; second nozzle array 433 ON |
| 15 | 2000 | 10000 | first nozzle array 432 OFF; second nozzle array 433 OFF |
| 1 | 0 | 3000 | first nozzle array 432 OFF; second nozzle array 433 OFF |

Figure 6:
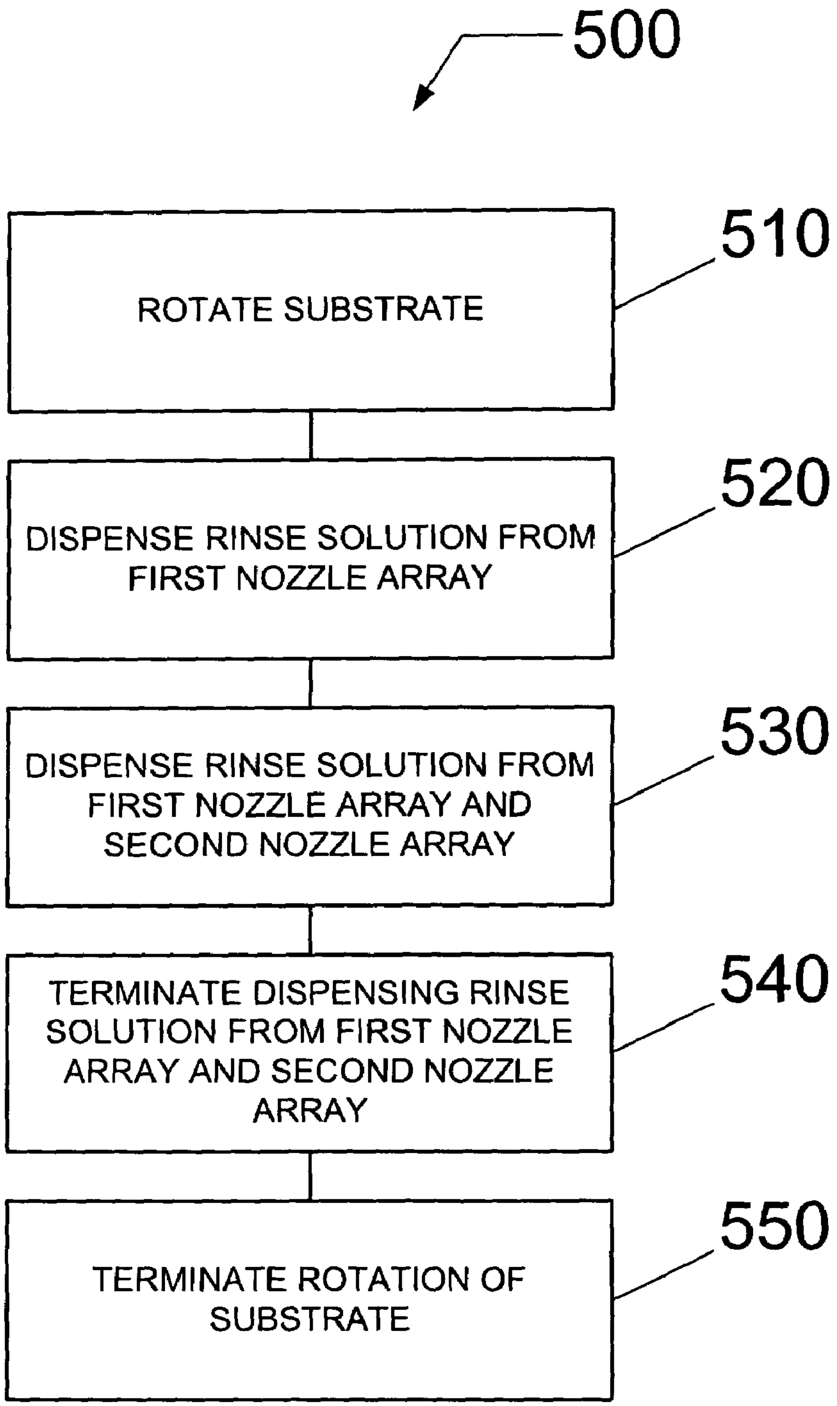
FIG. 6 depicts a method for dispensing a rinse solution on a substrate according to a further embodiment of the present invention.

Referring now to FIG. 6, a method of cleaning a substrate using a rinse solution nozzle assembly such as that shown in FIGS. 4 and 5 is depicted. FIG. 6 shows a flow chart 500 beginning at the step 510 of rotating the substrate on a substrate holder. The substrate rotation can have an acceleration phase such that the substrate rotation rate is increased from rest to a first pre-specified rate of rotation. Once the first pre-specified rotation rate is achieved, the rotation rate can be maintained invariant or varied.

At step 520, the rinse solution is dispensed from the first nozzle assembly onto the substrate for a first period of time.

The dispensing of rinse solution from the first nozzle array can be initiated coincident with the rotation of the substrate. Alternately, the dispensing of rinse solution from the first nozzle array can be initiated after a delay in time.

At step 530, the rinse solution is dispensed from the first nozzle array and the second nozzle array onto the substrate for a second period of time. At this point, the rate of rotation of the substrate can be maintained constant, or can be varied. For example, the rotation rate can be accelerated or decelerated (during an acceleration or deceleration phase) to a second pre-specified rate of rotation.

At step 540, the flow of rinse solution from the first nozzle array and the second nozzle array is terminated. The rate of rotation of the substrate can be maintained constant, or can be varied. For example, the rotation rate can be accelerated or decelerated (during an acceleration or deceleration phase) to a third pre-specified rate of rotation. At step 550, the rotation of the substrate is terminated. During this time, the rate of rotation is decreased to rest during a fourth period of time.

Thus, the method shown in FIG. 6 also provides gradual neutralization of any developer on the substrate in order to reduce substrate shock, followed by full hydraulic pressure across the radius of the substrate to provide sufficient cleaning.

Figure 7:
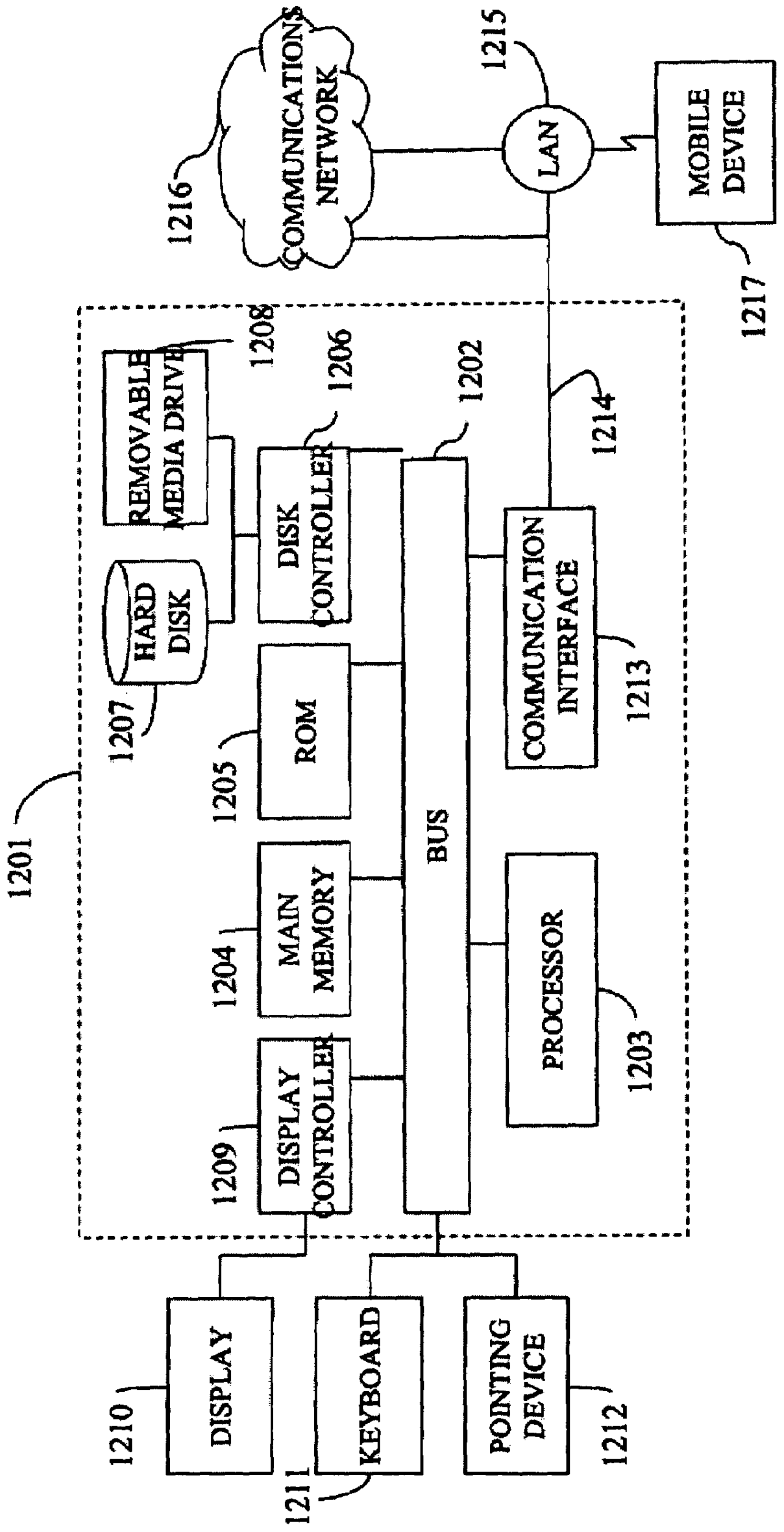
FIG. 7 depicts a computer system for implementing various embodiments of the present invention.

FIG. 7 illustrates a computer system 1201 for implementing various embodiments of the present invention. The computer system 1201 may be used as the controller 450 to perform any or all of the functions of the controller described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Hence, numerous modifications and variations of the present invention are possible in light of the above teachings. It is therefore to be understood that within the scope of the appended claims, the invention may be practiced otherwise than as specifically described herein. For example, other configurations of the solution nozzle assembly and other processes may be used to provide gradual neutralization of any developer on the substrate, followed by hydraulic pressure across the substrate area to provide sufficient cleaning without pH shock. One such configuration may be sequential operation of the nozzles of the nozzle array in a radial direction outward from the center of the substrate. Such a configuration may require a dedicated fluid valve for each of the nozzles in the array.

The invention claimed is:

1. A rinse solution nozzle assembly for dispensing a rinse solution on a substrate, comprising:

a first nozzle array including one nozzle disposed on a central axis extending normally from a center of the substrate, and configured to dispense said rinse solution substantially near the center of said substrate;

a first control valve coupled to said first nozzle array and configured to actuate a first flow rate of said rinse solution through said first nozzle array;

a second nozzle array including a plurality of nozzles, said nozzles arranged at fixed positions along a radial span aligned with the central axis and extending from near center of the substrate toward a perimeter of the substrate and configured to dispense said rinse solution across the radial span on a side of the substrate facing the first nozzle array;

a second control valve coupled to said second nozzle array and configured to actuate a second flow rate of said rinse solution through said second nozzle array; and a fluid supply line connecting a rinse solution supply to both the first control valve and the second control valve and supplying the rinse fluid solution through the fluid supply line both to the first control valve and to the second control valve for supply of the same rinse solution to both the first nozzle array and the second nozzle array.

2. The rinse solution nozzle assembly as recited in claim 1, further comprising:

a controller coupled to said first control valve and said second control valve, configured to control said first flow rate through said first nozzle array, and configured to control said second flow rate through said second nozzle array.

3. The rinse solution nozzle assembly as recited in claim 1, further comprising:

a rinse solution supply system coupled to the fluid supply line.

4. The rinse solution nozzle assembly as recited in claim 3, wherein said rinse solution supply system comprises at least one of a fluid supply valve, a filter, a flow measurement device, and a flow control device.

5. The rinse solution nozzle assembly as recited in claim 1, wherein said substrate is rotated during dispensing of said rinse solution.

6. The rinse solution nozzle assembly as recited in claim 1, wherein said rinse solution comprises de-ionized water.

7. The rinse solution nozzle assembly as recited in claim 2, wherein said controller is further configured to open said first control valve for a first period of time permitting a flow of the rinse solution through said first nozzle array.

8. The rinse solution nozzle assembly as recited in claim 7, wherein said controller is further configured to open said second control valve for a second period of time permitting a flow of the rinse solution through said first nozzle array and said second nozzle array following said first period of time.

9. A cleaning system for providing a rinse solution on a substrate, comprising:

a cleaning chamber;

a substrate holder coupled to said cleaning chamber and configured to support said substrate;

a drive unit coupled to said substrate holder and configured to rotate said substrate holder;

a rinse solution nozzle assembly coupled to said cleaning chamber and configured to dispense said rinse solution in said cleaning chamber;

said rinse solution nozzle assembly including, a first nozzle array including one nozzle disposed on a central axis extending normally from a center of the substrate holder, and configured to dispense said rinse solution substantially near the center of said substrate, a first control valve coupled to said first nozzle array and configured to actuate a first flow rate of said rinse solution through said first nozzle array, a second nozzle array including a plurality of nozzles, said nozzles arranged at fixed positions along a radial span aligned with the central axis and extending from near center of the substrate toward a perimeter of the substrate and configured to dispense said rinse solution across the radial span on a side of the substrate facing the first nozzle array, a second control valve coupled to said second nozzle array and configured to actuate a second flow rate of said rinse solution through said second nozzle array, and a fluid supply line connecting a rinse solution supply to both the first control valve and the second control valve and supplying the rinse solution both to the first control valve and to the second control valve for supply of the same rinse solution to both the first nozzle array and the second nozzle array; and a controller coupled to said first control valve and said second control valve of said rinse solution nozzle assembly, configured to control said first flow rate through said first nozzle array, and configured to control said second flow rate through said second nozzle array.

10. The cleaning system as recited in claim 9, wherein said controller is coupled to said drive unit and configured to control at least one of a rotation rate and a rotation rate acceleration of said drive unit.

11. A system for providing a rinse solution on a substrate, comprising:

means for supporting the substrate in a chamber;

means for rotating the substrate;

means for dispensing a rinse solution on a central axis disposed on a central axis extending normally from a center of the substrate in a first step to neutralize the surface of the substrate and a second step to provide hydraulic pressure from said rinse solution substantially along the entire surface of the substrate on a same side of the substrate as in the first step, and said means for dispensing including a fluid supply line connecting a rinse solution supply to both the first control valve and the second control valve and supplying the same rinse solution both separately to the center of the substrate and along the entire surface of the substrate by nozzles arranged at fixed positions along a radial span aligned with the central axis and extending from near center of the substrate toward a perimeter of the substrate.

* * * * *